US012525725B2

(12) United States Patent
Khaira et al.

(10) Patent No.: US 12,525,725 B2
(45) Date of Patent: Jan. 13, 2026

(54) ENERGY-EFFICIENT ACTIVE RECONFIGURABLE INTELLIGENT SURFACE WITH SELECTIVE AMPLIFICATION

(71) Applicant: Dell Products L.P., Round Rock, TX (US)

(72) Inventors: Navjot Kaur Khaira, Kanata (CA); Tejinder Singh, Kanata (CA)

(73) Assignee: Dell Products L.P., Round Rock, TX (US)

( * ) Notice: Subject to any disclaimer, the term of this patent is extended or adjusted under 35 U.S.C. 154(b) by 29 days.

(21) Appl. No.: 18/609,134

(22) Filed: Mar. 19, 2024

(65) Prior Publication Data

US 2025/0300363 A1 Sep. 25, 2025

(51) Int. Cl.
*H01Q 21/06* (2006.01)
*H01Q 1/36* (2006.01)
(Continued)

(52) U.S. Cl.
CPC ............. *H01Q 21/062* (2013.01); *H01Q 1/48* (2013.01); *H01Q 21/0075* (2013.01); *H03F 3/24* (2013.01)

(58) Field of Classification Search
CPC .......... H01Q 1/38; H01Q 13/106; H01Q 1/36; H01Q 13/10; H01Q 13/16; H01Q 21/005;
(Continued)

(56) References Cited

U.S. PATENT DOCUMENTS 10,770,790 B1 9/2020 Mahanfar
11,329,375 B1 * 5/2022 West ...................... H01Q 23/00
(Continued)

FOREIGN PATENT DOCUMENTS

CN 117768269 A 3/2024

OTHER PUBLICATIONS

A. R. Ndjiongue et al., "Re-configurable Intelligent Surface-Based VLC Receivers Using Tunable Liquid-Crystals: The Concept," in Journal of Lightwave Technology, vol. 39, No. 10, pp. 3193-3200, May 2021.
(Continued)

*Primary Examiner* — Wei (Victor) Y Chan
(74) *Attorney, Agent, or Firm* — Amin, Turocy & Watson, LLP

(57) ABSTRACT

The technology described herein is directed towards a design and implementation of a subarray of unit cells for an active reconfigurable intelligent surface that is power efficient. The reconfigurable intelligent surface design integrates a switch and a power amplifier in subarrays of unit cells to selectively amplify the reflected signal, resulting in a selectively active reconfigurable intelligent surface with relatively low power consumption. Further, rather than equipping each unit cell with its own switch and power amplifier, a switch and power amplifier is shared by each m×n (e.g., 3×3) subarray of unit cells, which can be arranged as a module of a larger reconfigurable intelligent surface. Via the switch, the design provides a device for receiving and reflecting the electromagnetic signal as an amplified or non-amplified signal by coupling the RF energy, processing, and selectively amplifying or not amplifying the reflected signal.

20 Claims, 10 Drawing Sheets

(51) Int. Cl.

| | |
|---|---|
| ***H01Q 1/38*** | (2006.01) |
| ***H01Q 1/48*** | (2006.01) |
| ***H01Q 21/00*** | (2006.01) |
| ***H03F 3/24*** | (2006.01) |

(58) Field of Classification Search

CPC .... H01Q 21/065; H01Q 21/28; H01Q 1/2291; H01Q 1/242; H01Q 1/243; H01Q 1/28

See application file for complete search history.

(56) References Cited

U.S. PATENT DOCUMENTS

| | | | | |
|---|---|---|---|---|
| 11,855,745 | B2 | 12/2023 | Schloemer | |
| 2016/0112117 | A1 | 4/2016 | Platzer et al. | |
| 2019/0334228 | A1 | 10/2019 | Haridas et al. | |
| 2022/0026524 | A1* | 1/2022 | Maruyama | H01Q 21/06 |
| 2022/0231411 | A1* | 7/2022 | Lin | H01Q 3/2694 |
| 2023/0142735 | A1 | 5/2023 | Raghavan et al. | |
| 2024/0014862 | A1 | 1/2024 | Duan et al. | |
| 2024/0364019 | A1* | 10/2024 | Hussain | H01Q 13/10 |
| 2025/0062529 | A1* | 2/2025 | Nathan | H01Q 21/064 |
| 2025/0125525 | A1 | 4/2025 | Rossanese et al. | |
| 2025/0274165 | A1 | 8/2025 | Manolakos et al. | |

OTHER PUBLICATIONS

R. Long, Y.-C. Liang et al., “Active Reconfigurable Intelligent Surface Aided Wireless Communications,” in IEEE Transactions on Wireless Communications, vol. 20, No. 8, pp. 4962-4975, Aug. 2021.

Q. Hu, X. Zeng et al., “Design of a Novel 2-bit Wideband Beam-Scanning Reconfigurable Intelligent Surface,” IEEE International Workshop on Electromagnetics: Applications and Student Innovation Competition (iWEM), pp. 1-3, China 2021.

J.-B. Gros, V. Popov et al., “A Reconfigurable Intelligent Surface at mmWave Based on a Binary Phase Tunable Metasurface,” IEEE Open Journal of the Communications Society, vol. 2, pp. 1055-1064, 2021.

D. F. Sievenpiper, J. H. Schaffner et al., “Two-dimensional beam steering using an electrically tunable impedance surface,” IEEE Transactions on Antennas and Propagation, vol. 51, No. 10, pp. 2713-2722, Oct. 2003.

C. Guclu, J. Perruisseau-Carrier et al., “Proof of concept of a dual-band circularly-polarized RF MEMS beam-switching reflectarray,” IEEE Transactions on Antennas and Propagation, vol. 60, No. 11, pp. 5451-5455, Nov. 2012.

X. Meng, M. Nekovee and D. Wu, “The Design and Analysis of Electronically Reconfigurable Liquid Crystal-Based Reflectarray Metasurface for 6G Beamforming, Beamsteering, and Beamsplitting,” IEEE Access, vol. 9, pp. 155564-155575, 2021.

M. Ojaroudi and V. Loscri, “Graphene-Based Reconfigurable Intelligent Meta-Surface Structure for THz Communications,” 15th European Conference on Antennas and Propagation (EUCAP), pp. 1-5, Germany 2021.

R. A. Tasci, F. Kilinc, E. Basar and G. C. Alexandropoulos, “A New RIS Architecture With a Single Power Amplifier: Energy Efficiency and Error Performance Analysis,” in IEEE Access, vol. 10, pp. 44804-44815, Apr. 2022.

W. Lv, J. Bai, Q. Yan and H. M. Wang, “RIS-Assisted Green Secure Communications: Active RIS or Passive RIS?,” in IEEE Wireless Communications Letters, vol. 12, No. 2, pp. 237-241, Feb. 2023.

ETSI TR 102 376-2 V1.2.1, “Digital Video Broadcasting (DVB); Implementation Guidelines for the Second Generation System for Broadcasting, Interactive Services, News Gathering and other Broadband Satellite Applications; Part 2: S2 Extensions (DVB-S2X)”, Jan. 2021, 212 pages.

Lee et al., “Integrated DVB-X2 Receiver Architecture with Common Acceleration Engine”, Applied Sciences, vol. 9, No. 3983, Sep. 23, 2019, 16 pages.

Nemer, Elias., “Physical Layer Impairments in DVB-S2 Receivers”, Second IEEE Consumer Communications and Networking Conference, 2005, pp. 487-492.

DVB ORG., “White Paper on the use of DVB-S2X for DTH applications, DSNG & Professional Services, Broadband Interactive Services and VL-SNR applications”, DVB Document A172, Mar. 2015, 16 pages.

Babcock, Stephen., “AT&T Invested $450M in Maryland Network Upgrades Over 3 Years”, Technical.ly, URL—https://technical.ly/startups/att-invested-450m-in-maryland-network-upgrades-over-3-years/, Jul. 9, 2019, Retrieved from the internet Dec. 2, 2024, 7 pages.

Tyree et al., “AT&T Providing Cell on Wheels to Help with Internet Connection at LU’s Graduation”, URL—https://wset.com/news/local/att-providing-cell-on-wheels-to-help-with-internet-connection-at-lus-graduation, May 10, 2017, Retrieved from the internet Dec. 2, 2024, 6 pages.

ITU, “H.222.0 : Information Technology—Generic Coding of Moving Pictures and Associated Audio Information: Systems”, International Telecom Union, Aug. 2018, 306 pages.

Cioni et al., “DVB-S2X Physical Layer Performance Results Over Realistic Channel Models”, International Journal of Satellite Communications and Networking, vol. 34, No. 3, Jul. 2015, 21 pages.

“MPEG Transport Stream”, Wikipedia, URL—https://en.wikipedia.org/wiki/MPEG_transport_stream , Retrieved from the internet Dec. 2, 2024, 10 pages.

Keese, Col. John E., “Satellite Telemetry, Tracking and Control Subsystems”, Massachusetts Institute of Technology, Oct. 29, 2003, 35 pages.

NASA, “State-of-the-Art of Small Spacecraft Technology”, NASA 9.0 Communications, Feb. 12, 2024, 32 pages.

Goldman et al., “SpaceX and T-mobile Focus on Direct Satellite-to-Smartphone to Improve Mobile Coverage in Remote Areas”, Analysys Mason, Aug. 2022, 5 pages.

Jewett, Rachel, “How Big is the Satellite Industry’s Direct-to-Device Opportunity?”, Via Satellite, Sep. 12, 2023, URL—https://www.satellitetoday.com/connectivity/2023/09/12/how-big-is-the-satellite-industrys-direct-to-device-opportunity/, Retrieved from the internet Dec. 2, 2024, 4 pages.

“Electromagnetic Metasurface”, Wikipedia, URL—https://en.wikipedia.org/wiki/Electromagnetic_metasurface#, Retrieved from the internet Dec. 2, 2024, 9 pages.

Schweber, Bill., “The Doppler Effect: From Highly Ridiculed to Absolutely Indispensable, Part 1”, Electrical Engineering News and Products, Apr. 19, 2022, URL—https://www.eeworldonline.com/the-doppler-effect-from-highly-ridiculed-to-absolutely-indispensable-part-1/, Retrieved from the internet Dec. 2, 2024, 14 pages.

“Doppler Effect”, Wikipedia, URL—https://en.wikipedia.org/wiki/Doppler_effect, Retrieved from the internet Dec. 2, 2024, 8 pages.

Long et al., “A Promising Technology for 6G Wireless Networks: Intelligent Reflecting Surface”, Journal of Communications and Information Networks, vol. 6, No. 1, Mar. 2021, 16 pages.

Singh et al., “Recent Advancements in Reconfigurable mmWave Devices Based on Phase-Change and Metal Insulator Transition Materials”, IEEE Journal of Microwaves, vol. 3, No. 2, Apr. 2023, pp. 827-851.

Rodrigues et al., “Efficient Power Allocation Strategies in Hybrid Active-Passive Reconfigurable Intelligent Surfaces”, IEEE Communications Letters, vol. 28, No. 1, Jan. 2024, pp. 113-117.

Rodrigues et al., “Optimized Phase Shifts in Intelligent Reflective Surfaces for Robust Radar-based Indoor Coverage Enhancement”, Proceedings of the SPIE, Radar Sensor Technology XXVII, vol. 12535, 2023. pp. 64-76.

3GPP TR 23.737 V17.0.0, “3rd Generation Partnership Project; Technical Specification Group Services and System Aspects; Study on architecture aspects for using satellite access in 5G, (Release 17)”, Dec. 2019, 82 pages.

3GPP TR 28.808 V17.0.0, “3rd Generation Partnership Project; Technical Specification Group Services and System Aspects Study on Management and Orchestration Aspects of Integrated Satellite Components in a 5G Network, (Release 17)”, Mar. 2021, 30 pages.

(56) References Cited

OTHER PUBLICATIONS

3GPP TS 38.108 V17.0.0, 3rd Generation Partnership Project; Technical Specification Group Radio Access Network; NR; Satellite Access Node radio transmission and reception, (Release 17), Jun. 2022, 58 pages.
"DVB", Wikipedia, URL—https://en.wikipedia.org/wiki/DVB, Retrieved from the internet Dec. 2, 2024, 12 pages.
"DVB-S", Wikipedia, URL—https://en.wikipedia.org/wiki/DVB-S, Retrieved from the internet Dec. 2, 2024, 2 pages.
"DVB-S2", Wikipedia, URL—https://en.wikipedia.org/wiki/DVB-S2, Retrieved from the internet Dec. 2, 2024, 7 pages.
"DVB-S2X", Wikipedia, URL—https://en.wikipedia.org/wiki/DVB-S2X, Retrieved from the internet Dec. 2, 2024, 2 pages.
The Ad Hoc Group., "White Paper on the use of DVB-S2X for DTH Applications, DSNG & Professional Services, Broadband Interactive Services and VL-SNR applications", Digital Video Broadcasting, Mar. 2015, 16 pages.
DVB ORG., "Implementation Guidelines for the Second Generation System for Broadcasting, Interactive Services, News Gathering and Other Broadband Satellite Applications; Part 2: S2 Extensions (DVB-S2X)", ETSI TR 102 376-2 V1.2.1, Jan. 2021, 212 pages.
DVB ORG., "Second Generation Framing Structure, Channel Coding and Modulation Systems for Broadcasting, Interactive Services, News Gathering and Other Broadband Satellite Applications; Part 2: DVB-S2 Extensions (DVB-S2X)", DVB Document A083-2 Rev.4, Feb. 2024, 166 pages.
"Facts and Figures 2022—Mobile Network Coverage 2022", ITU, URL—https://www.itu.int/itu-d/reports/statistics/2022/11/24/ff22-mobile-network-coverage/, Retrieved from the internet Dec. 2, 2024, 4 pages.
Kenfack et al., "Modeling of a DVB-S2 Transmission Chain with Optimization of Adjustment Parameters for a Good Quality of the Reception Signal", International Journal of Communications, Network and System Sciences, vol. 16, Jan. 31, 2023, pp. 1-20.
ETSI EN 300 421 V1.1.2, "Digital Video Broadcasting (DVB); Framing Structure, Channel Coding and Modulation for 11/12 Ghz Satellite Services", Aug. 1997, 24 pages.
ETSI EN 302 307-1 V1.4.1, "Digital Video Broadcasting (DVB); Second Generation Framing Structure, Channel Coding and Modulation Systems for Broadcasting, Interactive Services, News Gathering and Other Broadband Satellite Applications; Part 1: DVB-S2", Jul. 2014, 80 pages.
ETSI EN 302 307 V1.2.1, Digital Video Broadcasting (DVB); Second Generation Framing Structure, Channel Coding and Modulation Systems for Broadcasting, Interactive Services, News Gathering and Other Broadband Satellite Applications (DVB-S2), Aug. 2009, 78 pages.
ETSI TR 102 376-1 V1.2.1, "Digital Video Broadcasting (DVB); Implementation Guidelines for the Second Generation System for Broadcasting, Interactive Services, News Gathering and other Broadband Satellite Applications; Part 1: DVB-S2", Nov. 2015, 118 pages.
Stuhlfauth, Reiner. "5G NTN Takes Flight: Technical Overview of 5G Non-Terrestrial Networks", Rohde & Schwarz, White Paper, Version 01.00, 2022, 124 pages.
Dhaou, Riadh. "Modeling of Networks Composed of Satellite Constellations" University of Paris VI Dissertation, Nov. 8, 2002 [https://www.researchgate.net/publication/265231818_MODELING_OF_NETWORKS_COMPOSED_OF_SATELLITE_CONSTELLATIONS], 225 pages.
"Aerial SDK Layer 1" Nvidia Docs Hub, https://docs.nvidia.com/aerial/archive/aerial-sdk/23-1/text/product_brief/aerial_sdk_layer_1.html] retrieved Jan. 16, 2025, 30 pages.
qorvo.com, "CMD262 26-28 GHz (Ka Band) GaN Power Amplifier", Rev-A, URL—https://www.qorvo.com/products/CMD262, Jun. 14, 2022, 1 page.
Healy, et al. "Layer-1 Physical Interface Transcoder Leveraging Metasurfaces" U.S. Appl. No. 18/899,886, filed Sep. 27, 2024, 63 pages.
Healy, et al. "Connecting Wi-Fi-Enabled Device to Non-Terrestrial Satellite Constellations" U.S. Appl. No. 18/899,909, filed Sep. 27, 2024, 55 pages.
Khaira, et al. "Layer-1 Physical Interface Transcoder With Signal Processing Capabilities to Support Hybrid Terrestrial and Non-Terrestrial Ground and Space Mesh Network" U.S. Appl. No. 18/902,052, filed Sep. 30, 2024,79 pages.
Healy, et al. "Universal Layer-1 Physical Interface Transcoder for Terrestrial and Non-Terrestrial Air-Interfaces" U.S. Appl. No. 18/899,739, filed Sep. 27, 2024, 62 pages.
Singh, et al. "Metasurface Integrated Non-Terrestrial Network Transcoder With Adaptive Slicing for Dynamic Allocation of Mesh Resources" U.S. Appl. No. 18/902,100, filed Sep. 30, 2024, 64 pages.
Singh, et al. "Edge Computing and Metasurfaces in Non-Terrestrial Network-Connected Transcoder Nodes" U.S. Appl. No. 18/902,158, filed Sep. 30, 2024, 66 pages.
Healy, et al. "High-Availability Communication Link That Supports Terrestrial and Non-Terrestrial Networks Including for Disaster-Relief and Emergency Management Services" U.S. Appl. No. 18/902,268, filed Sep. 30, 2024, 75 pages.
Singh, et al. "Allocating Primary and Secondary Metasurface Integrated Non-Terrestrial Network Transcoder Nodes" U.S. Appl. No. 18/902,360, filed Sep. 30, 2024, 64 pages.
Healy, et al. "Model-Controlled Layer-1 Physical Interface Transcoder to Support Hybrid Terrestrial and Non-Terrestrial Ground and Space Mesh Network" U.S. Appl. No. 18/899,504, filed Sep. 27, 2024, 64 pages.
Khaira, et al. "Enhancing Network Resiliency and Performance Through Multipath Routing With Metasurface-Integrated Portable Transcoder" U.S. Appl. No. 18/902,395, filed Sep. 30, 2024, 50 pages.
Singh, et al. "Secure Non-Terrestrial Network Links Utilizing Quantum Key Distribution Integrated Into a Metasurface Transcoder Node With Hardware Polarization Control" U.S. Appl. No. 18/902,422, filed Sep. 30, 2024, 37 pages.
Singh, et al. "Signal Correction Based on Environmental Factors in Metasurfaces for Non-Terrestrial Network Transcoder Nodes" U.S. Appl. No. 18/902,454, filed Sep. 30, 2024, 53 pages.
Singh, et al. "Reconfigurable Intelligent Surface With Variable Amplification and Attenuation Including Angle of Arrival Estimation of Wireless Signals" U.S. Appl. No. 18/797,975, filed Aug. 8, 2024, 46 pages.
Khaira, et al. "Energy-Efficient Active Reconfigurable Intelligent Surface With Integrated Sub-Array Power Amplifiers and Signal Coupling" U.S. Appl. No. 18/586,838, filed Feb. 26, 2024, 33 pages.
Singh, et al. "Reconfigurable Intelligent Surface Integrated on Compact Drones for Wireless Network Survey" U.S. Appl. No. 18/913,434, filed Oct. 11, 2024, 36 pages.
Singh, et al. "Real-Time Data Management and Integrity Assurance for Artificial Intelligence-Driven Millimeter Wave Advanced Metasurfaces" U.S. Appl. No. 18/656,407, filed May 6, 2024, 44 pages.
Singh, et al. "Reconfigurable Intelligent Surfaces That Self Heal and Adapt by Altering the Tile Geometry" U.S. Appl. No. 18/656,431, filed May 6, 2024, 74 pages.
Singh, et al. "Predictive Signal Boosting in Distributed Tile Controllers for Reconfigurable Metasurfaces" U.S. Appl. No. 18/656,441, filed May 6, 2024, 54 pages.
Ye, et al. "Enhancing Non-Terrestrial Network Direct-to-Everything Service With Metasurfaces" U.S. Appl. No. 18/739,880, filed Jun. 11, 2024, 39 pages.
Singh, et al. "Metasurface Subarrays With Integrated Amplification and Tunable Delay for Estimating Angle of Arrival and Redirecting Wireless Signals" U.S. Appl. No. 18/750,710, filed Jun. 21, 2024, 41 pages.
Healy, et al. "Transcoding the Air-Interface Between Non-Terrestrial and Terrestrial Networks Leveraging Integrated Transcoder and Metasurface Mounted on a Drone" U.S. Appl. No. 18/780,254, filed Jul. 22, 2024, 61 pages.
Healy, et al. "Communication Between Non-Terrestrial and Terrestrial Networks Based on Layer-1 Physical Packet-Level Transcoding" U.S. Appl. No. 18/780,269, filed Jul. 22, 2024, 59 pages.

(56) References Cited

OTHER PUBLICATIONS

Notice of Allowance received for U.S. Appl. No. 18/797,975 dated Sep. 19, 2025, 9 pages.
Non-Final Office Action received for U.S. Appl. No. 18/656,441 dated Sep. 22, 2025, 7 pages.
Notice of Allowance received for U.S. Appl. No. 18/656,441 dated Nov. 19, 2025, 5 pages.
Notice of Allowance received for U.S. Appl. No. 18/739,880 dated Nov. 12, 2025, 10 pages.

* cited by examiner

ENERGY-EFFICIENT ACTIVE RECONFIGURABLE INTELLIGENT SURFACE WITH SELECTIVE AMPLIFICATION

BACKGROUND

Reconfigurable intelligent surfaces (alternatively referred to as intelligent reflective surfaces, or metasurfaces) are manmade thin reflective or refractive surfaces whose electromagnetic response can be electronically controlled. Reconfigurable intelligent surfaces are characterized by their two-dimensional arrays of electronically controllable reflecting elements that can dynamically manipulate electromagnetic waves by altering attributes such as phase, amplitude, and direction of the incoming signal. Because of their ability to alter the attributes of signals reflected at the surface, intelligent reflective surfaces are being evaluated for use in beyond fifth generation (B5G) and sixth generation (6G) wireless communication and wireless sensing networks.

In communications assisted by a reconfigurable intelligent surface, signal strength at the receiver is significantly constrained by the distance the signal needs to travel. Increasing the size of the reconfigurable intelligent surface is a common method to counteract free-space signal loss, but this can be costly and energy-intensive.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
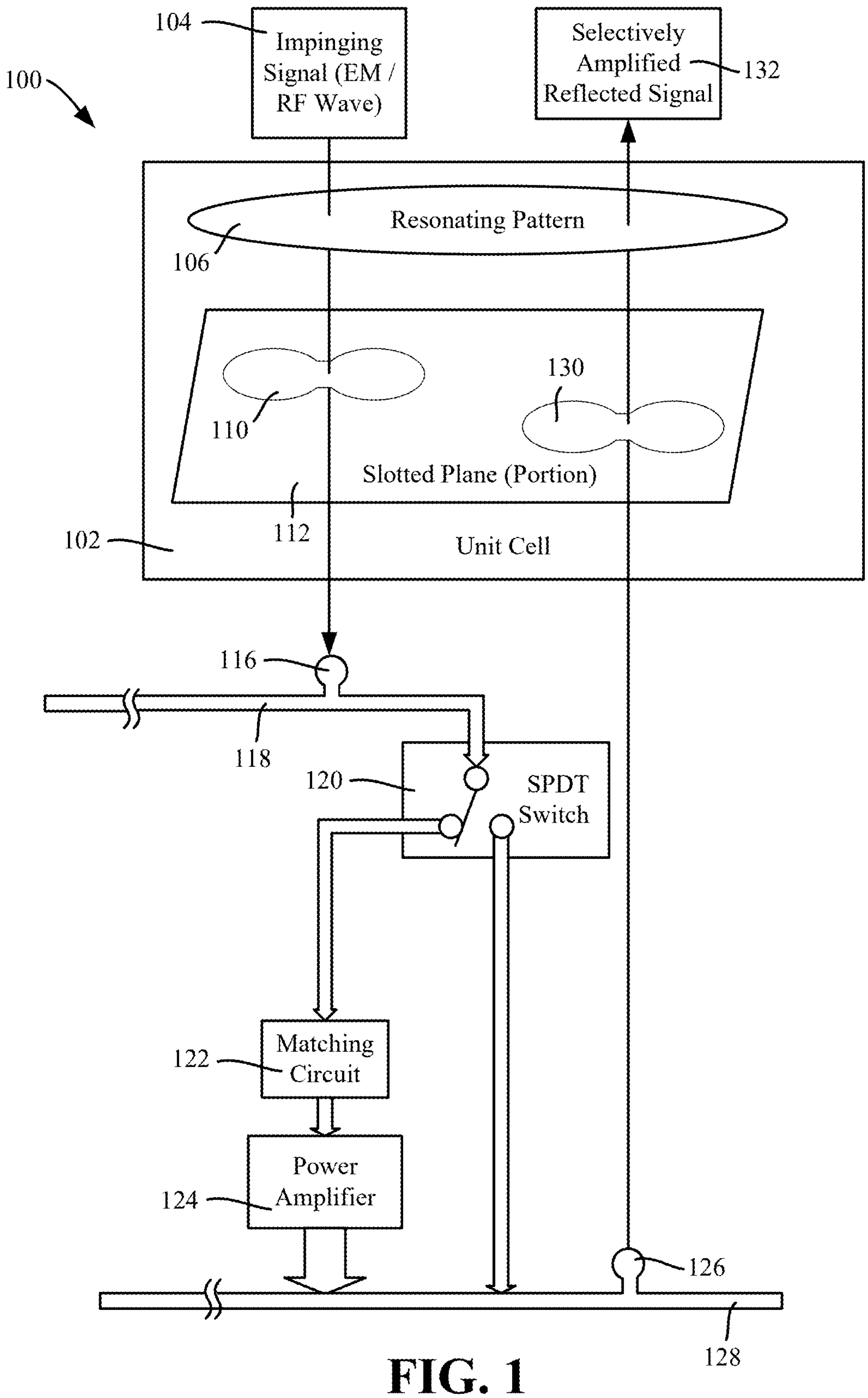
FIG. 1 is an example conceptual block diagram showing a unit cell of a reconfigurable intelligent surface for reflecting an incoming signal with selective amplification (amplification or no amplification), in accordance with various example embodiments and implementations of the subject disclosure.

The technology described herein is generally directed towards a reconfigurable intelligent surface design and implementation that facilitates selective amplification of signals reflected by the reconfigurable intelligent surface. An integrated switch provides for selective control over signal amplification, to allow for enhancement by amplification only when deemed appropriate. The technology thus efficiently manages power consumption while improving the overall functionality of a reconfigurable intelligent surface.

Further, the devices (subarrays including unit cells) that make up a reconfigurable intelligent surface can receive and reflect incoming electromagnetic signals in the same polarization, including by coupling the radio frequency (RF) energy via dividing and combining circuits, and by selectively amplifying the reflected signal. Still further, the switch and power amplifier can be shared among an m×n subgroup of unit cells (elements) of a reconfigurable intelligent surface. For example, utilizing a single power amplifier for every 3×3 subgroup of the elements leads to a 9× reduction in the number of power amplifiers. This significant reduction effectively diminishes expenses, power consumption, heat generation, and interference.

In one example implementation, by integrating power amplifiers and (e.g., single-pole, double-throw) switches, powered by an external DC voltage source, onto the reconfigurable intelligent surface, selective signal amplification is achieved. A modular layout of the subarrays enables the design to be scalable to larger reconfigurable intelligent surface dimensions while maintaining an efficient use of power amplifiers via the concept of having a subarray share a set of powered components.

In one example implementation, the subarray of unit cells has layered and integrated components, including four metal layers, namely a resonating patterns layer, a slotted plane layer for signal coupling, a microstrip network for signal combining and dividing, and a ground plane with a reserved area of terminals for coupling the powered components to a DC voltage source. Between every two metal layers, there is an intervening layer of dielectric material.

The power amplifier and its associated impedance matching circuitry, along with the switch, are surface mounted on the topmost layer. This layer, containing resonating elements, initially captures the incoming signal. Beneath each element, there are two types of slots, namely one for receiving and the other for transmitting. Incoming signal energy is captured through the receiving slots and funneled into the subarray's combining circuit, then directed through inter-layer vias to the surface mounted switch. This switch is controllable to toggle between operational states, such that in one state at one time the switch directs the signal through the power amplifier for amplification, while in another state at another time bypasses the power amplifier. In either state, the signal (amplified or non-amplified) is routed to the dividing circuit, which then redistributes the signal among the reconfigurable intelligent surface elements for re-radiation in the desired direction. In case of amplification, the enhanced signal is equally distributed among the transmitting slots and re-emitted from the top metallic elements.

It should be understood that any of the examples and/or descriptions herein are non-limiting. Thus, any of the embodiments, example embodiments, concepts, structures, functionalities or examples described herein are non-limiting, and the technology may be used in various ways that provide benefits and advantages in communications and computing in general.

Reference throughout this specification to "one embodiment," "an embodiment," "one implementation," "an implementation," etc. means that a particular feature, structure, characteristic and/or attribute described in connection with the embodiment/implementation can be included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, characteristics and/or attributes may be combined in any suitable manner in one or more embodiments/implementations. Repetitive description of like elements employed in respective embodiments may be omitted for sake of brevity.

The detailed description is merely illustrative and is not intended to limit embodiments and/or application or uses of embodiments. Furthermore, there is no intention to be bound by any expressed or implied information presented in the preceding sections, or in the Detailed Description section. Further, it is to be understood that the present disclosure will be described in terms of a given illustrative architecture; however, other architectures, structures, materials and process features, and steps can be varied within the scope of the present disclosure.

It also should be noted that terms used herein, such as "optimize," "optimization," "optimal," "optimally" and the like only represent objectives to move towards a more optimal state, rather than necessarily obtaining ideal results. Similarly, "maximize" means moving towards a maximal state (e.g., up to some processing capacity limit), not necessarily achieving such a state, and so on.

It will also be understood that when an element such as a layer, region or substrate is referred to as being "on" or "over" "atop" "above" "beneath" "below" and so forth with respect to another element, it can be directly on the other element or intervening elements can also be present. In contrast, only if and when an element is referred to as being "directly on" or "directly over" another element, are there no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

The following detailed description is merely illustrative and is not intended to limit embodiments and/or application or uses of embodiments. Furthermore, there is no intention to be bound by any expressed or implied information presented in the preceding sections, or in the Detailed Description section.

One or more example embodiments are now described with reference to the drawings, in which example components, graphs and/or operations are shown, and in which like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details, and that the subject disclosure may be embodied in many different forms and should not be construed as limited to the examples set forth herein.

FIG. 1 is a conceptual depiction of an example system 100 including a unit cell 102 that redirects (reflects or refracts) an impinging (incoming) signal 104, (an electromagnetic (EM)/radio frequency (RF) wave, such as near or within the millimeter wavelength, e.g., above 25 gigahertz). A metallic resonating pattern 106 resonates at a frequency that corresponds to the frequency of the incoming signal. As set forth herein, a unit cell 102 can have a resonating pattern 106 of any suitable shape (e.g., square, rectangular, concentric ring-shape, coupled circles and so on) that resonates at a corresponding frequency of the incoming signal, and is thus not limited to any particular pattern.

A first opening 110 (e.g., an hourglass-shaped opening) in a slotted plane 112 beneath and electrically insulated from the metallic resonating pattern 106 passes (e.g., RF couples/transfers) the signal 106 to a contact/terminal 116 of a first microstrip line 118 that is beneath and electrically insulated from the slotted plane 112. The slotted plane, which blocks the incoming RF signal (except via the opening 110) can be divided into electrically separated portions, e.g., one per unit cell, to help mitigate potential interference with respect to other unit cells. As set forth herein, a unit cell 102 can have an opening 110 of any suitable shape and size that passes the corresponding frequency of the incoming signal 104, and is thus not limited to hourglass-shaped openings. Example alternatives include, but are not limited to, rectangular slots, circular coupled slots, or ring-shaped slots; indeed the slots can have any arbitrary slot shape that can couple a maximum amount of signal to and from the microwave circuit/signal pickup terminals (of microstrip lines as described herein) underneath.

The first microstrip line 118 is coupled to a switch 120 (e.g., a single-pole, double-throw, or SPDT switch), which is controlled to be in a first operational state or a second operational state. The first operational state of the switch 120 selectively couples the first microstrip line 118 via an impedance matching circuit 122 to a power amplifier 124, such that the incoming signal passed to the terminal 118 is amplified. The output of the power amplifier 124 is electrically coupled to a contact/terminal 126 via an electrical coupling of the power amplifier 124 to a second microstrip line 128. Via the contact/terminal 126, the amplified signal is passed through a second opening 130 (e.g., an hourglass-shaped opening) in the slotted plane 112, by which the amplified and delayed signal reaches the resonating pattern 106, resulting in an amplified and delayed redirected (e.g., reflected) signal 132 when the switch 120 (as represented in FIG. 1) is in the first operational state.

The second operational state of the switch 120, not explicitly represented in FIG. 1, selectively couples the first microstrip line 118 to the second microstrip line 128, bypassing amplification. Via the contact/terminal 126, the non-amplified signal is passed through a second opening 130 (e.g., an hourglass-shaped opening) in the slotted plane 112, by which the non-amplified signal reaches the resonating pattern 106, resulting in a redirected (e.g., reflected) non-amplified signal. Among other benefits, selectively bypassing amplification conserves energy.

As will be understood, the switch 120, matching circuit 122 and power amplifier 124 are shared, via the first microstrip line 118 and the second microstrip line 128, with one or more other unit cells. This reduces the high energy cost associated with each power amplifier. For example, a 3×3 subarray (subgroup) of unit cells based on the shared power amplifier design described herein results in only one amplifier for each subarray of nine unit cells, or one-ninth of the energy consumed by having a power amplifier per unit cell. As can be readily appreciated, instead of the 3×3 subarray used in the examples herein, other subarrays can be used, e.g., 2×2, 4×4, 5×5 and so on, depending on the tradeoff between power usage and the strength of the amplified reflected signal. Moreover, a non-symmetrical subgroup/subarray can be used, e.g., 3×4, 3×5 and so on; however symmetrical subgroups having the same number of unit cells in each dimension (m=n) allow for modular design, as does having a reconfigurable intelligent surface made of same-sized subarrays, which also keeps design computations straightforward. The gain can be increased by less elements per amplifier, while the reflected beam is narrowed by more elements per amplifier; the cost versus elements per module/amplifier is a tradeoff that can be matched to a particular scenario where a reconfigurable intelligent surface is desired.

To summarize thus far, a significant enhancement to reconfigurable intelligent surface technology is described herein by the integration of and selective use of power amplifiers. During the fabrication process, the switches and power amplifiers can be surface mounted onto a reconfigurable intelligent surface. To avoid the high cost and power demands of outfitting each reconfigurable intelligent surface element (unit cell) with a switch and power amplifier, described herein is integrating a switch and power amplifier with every m×n cluster (subgroup) of elements. In one implementation, in order to get a wide bandwidth response, two hourglass-shaped slots are used to couple the RF energy from the incoming signal and then transmit the reflected signal. When coupled to the power amplifiers, proper impedance matching between the reconfigurable intelligent surface elements is maintained by using the matching circuits to minimize signal reflection.

In the reconfigurable intelligent surface based on the technology described herein, signal amplification is thus achieved, when selected, by integrating power amplifiers into the reconfigurable intelligent surface, powered by an external DC voltage source. The power needed for the amplification functionality depends on the factors such as the type of power amplifier (PA) used, and the number of reconfigurable intelligent surface subarrays used in the complete reconfigurable intelligent surface panel. Different surface mounted device power amplifiers are commercially available, some of which are extremely power efficient depending on the technology used. For example, using a typical gallium nitride-based power amplifier at the targeted operating frequency range (26 to 28 GHz) in a 9×9 unit cell subarray needs V=20 V and I=350 mA, or a power P=7 W.

Figure 2A:
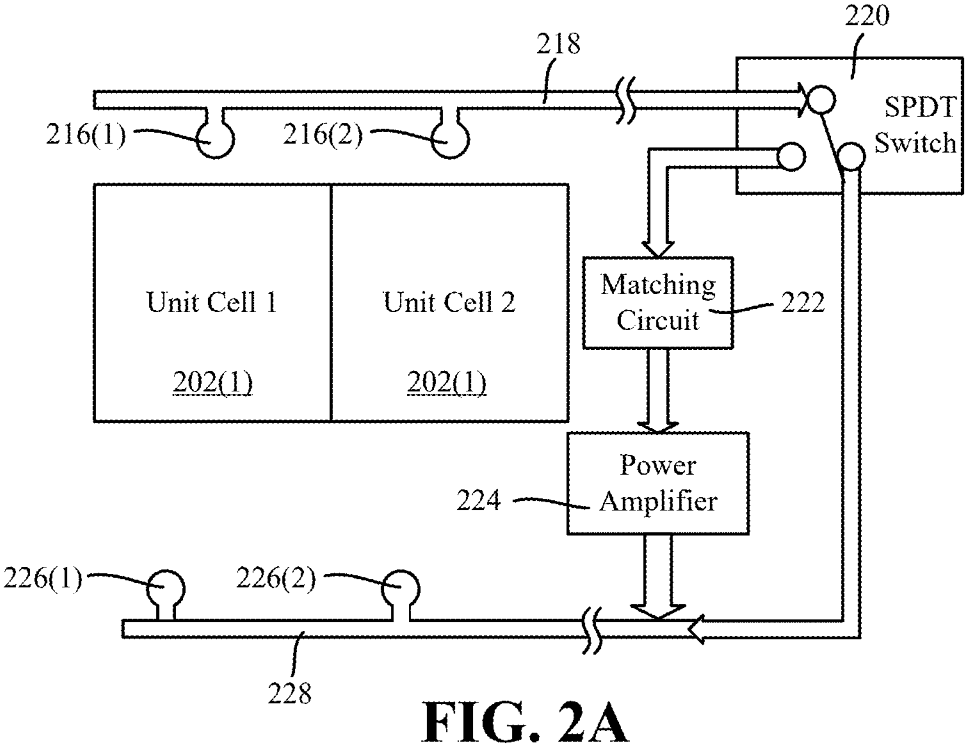
FIG. 2A is an example conceptual block diagram showing unit cells of a subarray of a reconfigurable intelligent surface that share circuitry for reflecting an incoming signal with selective amplification, in accordance with various example embodiments and implementations of the subject disclosure.

FIG. 2A shows the concept of unit cells 202(1) and 202(2) sharing a switch 220, matching circuit 222, and power amplifier 224. The first (incoming signal) microstrip line 218 has a contact/terminal 216(1) and 216(2) for the unit cells 202(1) and 202(2), respectively, to couple the incoming signal to the switch 220. As can be seen, the contacts 216(1) and 216(2) of microstrip line 218 for the unit cells 202(1) and 202(2), respectively, act as a combining circuit that captures the incoming signal energy, directed through inter-layer vias (described herein) to the surface mounted switch 120.

In the second operational state of the switch 220 as represented in FIG. 2, the switch 120 electrically couples the first microstrip line 218 to the second microstrip line 228. In the first operational state of the switch 220, (not explicitly represented in FIG. 2), the switch 120 electrically couples the first microstrip line 218 to the shared matching circuit 222 and power amplifier 224. Thus, in the first switch state, the amplified output signal of the shared matching circuit 222 and power amplifier 224 is electrically coupled to the second microstrip line 228, which has a contact/terminal 226(1) and 226(2) for the unit cells 202(1) and 202(2), respectively, to couple the amplified signal to their respective metallic resonating patterns as generally described with reference to FIG. 1.

In general, providing selective amplification capabilities within a reconfigurable intelligent surface presents a solution to increasing signal strength, such as to increase the distance a signal needs to travel or deal with adverse network conditions, without necessarily increasing the size of the reconfigurable intelligent surface. This is in contrast to present reconfigurable intelligent surface-based systems that are "passive" in that they do not possess the ability to amplify signals during wave-matter interactions. To enhance the effectiveness of reconfigurable intelligent surface in signal transmission, power amplifiers within the reconfigurable intelligent surface subgroups (subarrays) boost the strength of the reflected signals. The integration of switches as described herein facilitates selective amplification, allowing a reconfigurable intelligent surface (e.g., a controller coupled thereto) to intelligently determine when amplification is needed, thereby conserving energy when not needed. Further, example designs described herein also significantly reduce the number of amplifiers, such as employing just one power amplifier for every m×n reconfigurable intelligent surface elements, which leads to lower costs, reduced power consumption, reduced heat dissipation, lesser signal distortion, and more manageable interference.

Figure 2B:
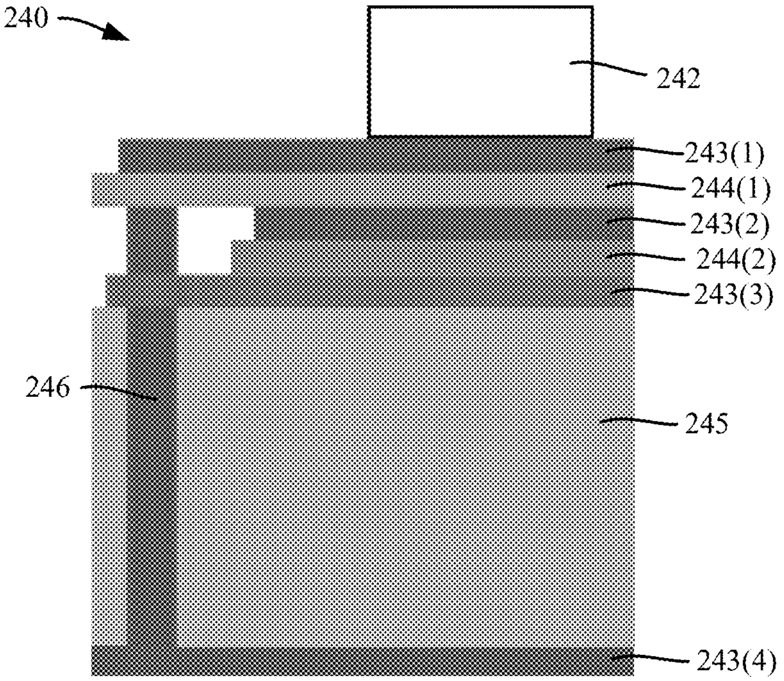
FIG. 2B is a side view of a stack of layers of an example unit cell, in accordance with various example embodiments and implementations of the subject disclosure.

FIG. 2B shows a side view of an example implementation of a subarray 240 showing how the subarray 240 can be configured as a stack of layers. The depicted layers include the surface-mounted components 242, a topmost (first) metal layer 243(1) that corresponds to the layer of the resonating elements, a first dielectric layer 244(1), a second metal layer 243(2) (that corresponds to the slotted plane 112 of FIG. 1), a second dielectric layer 244(2), and a third metal layer 243(3) (that corresponds to the first microstrip line 118 and the second microstrip line 128 of FIG. 1). The dielectric layers are generally transparent to the frequency of the incoming and outgoing signals. These layers are atop a dielectric substrate 245, with a fourth metal layer 243(4) that is the metal ground layer. Also shown on the left side of the subarray 240 is one of the vias 246.

Figure 3:
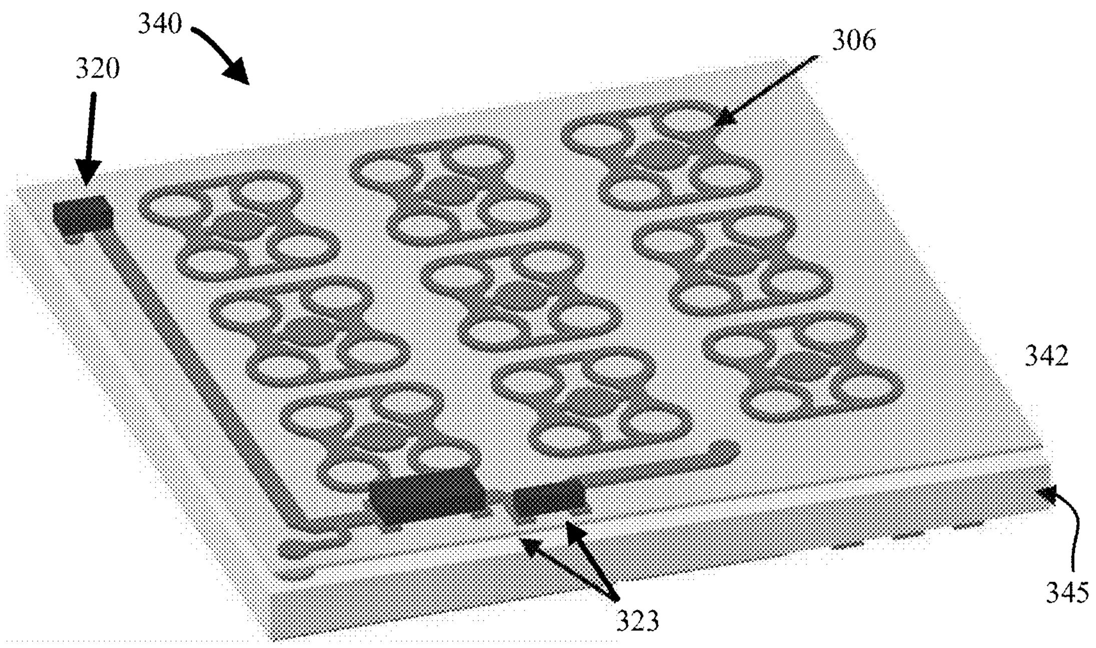
FIG. 3 is a top view representation of an example design of a subarray that includes resonating metallic patterns and surface mounted components above a dielectric substrate, in accordance with various example embodiments and implementations of the subject disclosure.

FIG. 3 shows a three-dimensional perspective view of an example implementation of a 3×3 subarray 340 in which top-layer components are visible above a dielectric substrate 345. In FIG. 3, one of the resonating metallic patterns is labeled as 306. The switch 320 in this example implementation is a surface mounted component, as are the amplifier and matching circuit (collectively labeled 323).

Figure 4:
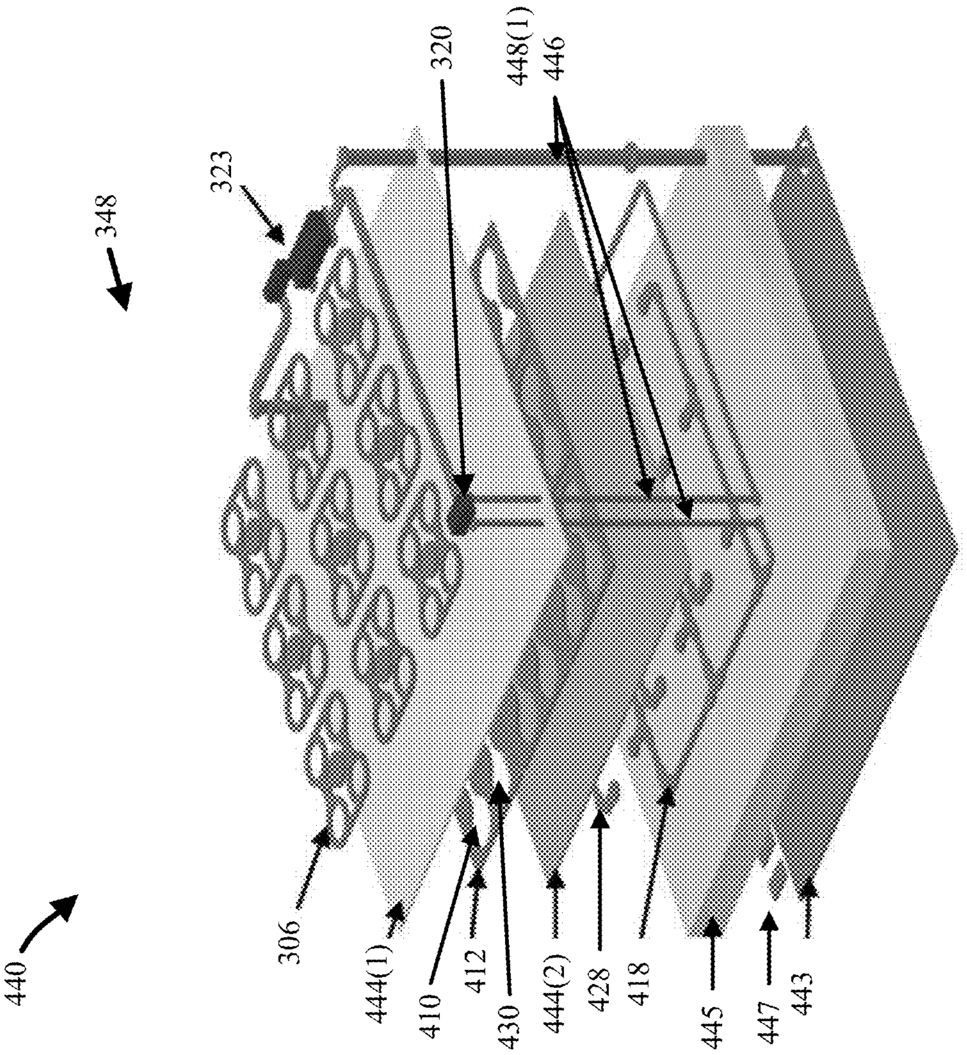
FIG. 4 is an exploded view representation of the example design of FIG. 3 showing a stack of layers of the subarray, in accordance with various example embodiments and implementations of the subject disclosure.

FIG. 4 shows an exploded view perspective representation 440 of the example fabricated 3×3 subarray 330 of unit cells of FIG. 3, including the resonating patterns of each unit cell. As in FIG. 3, the resonating pattern 306 of one unit cell is labeled, with labels for the other resonating patterns of the other unit cells omitted for clarity. Also shown at the upper layer are the surface mounted switch 320, and the surface mounted amplifier and matching circuit (collectively labeled 323).

The next layer down is a first dielectric layer 444(1), with the metallic slotted plane layer 412 beneath the first dielectric layer 444(1). Note that a single shared dielectric 444(1) is shown at this upper dielectric layer, however such an upper dielectric layer can be separated into parts (e.g., 3×3) for each unit cell, such as to facilitate separate fabrication of each unit cell.

The metallic slotted plane layer 412 includes the (e.g., hourglass-shaped) openings, two of which are labeled 410 (for passing the incoming signal) and 430 (for passing the returning signal, which may or may not be amplified as described herein). In the example representation of FIG. 4, the first opening and second paired openings of the slotted plane for each unit cell are depicted as side-by-side. A unit cell thus includes the resonating metallic pattern (e.g., 306), part of the upper dielectric layer 308 (which can be separate or part of one dielectric shared among unit cells), and the slotted plane portion 412 with RF coupling openings (e.g., 410 and 430).

The next layer beneath the metallic slotted plane layer 412 is a second dielectric layer 444(2), which insulates the metallic slotted plane layer 412 from the metallic microstrip line layer. The metallic microstrip line layer includes the first microstrip line 418 and the second microstrip line 428, which are RF coupled to each unit cell, with the first microstrip line 318 electrically coupled to provide the input signal to the switch 320 by an interlayer via. Accordingly, also shown in FIG. 4 are vias (collectively 446), which couple the first microstrip line 418 and the second microstrip line 428 to the switch 320, and the amplifier and matching circuit 323 output to the second microstrip line 428. Still other interlayer vias can be used to provide power to the surface mounted components and control signaling to toggle the switch states.

The components above and including the first microstrip line 418 and the second microstrip line 428 are supported on the dielectric substrate 445. A metallic ground plane 443 is primarily beneath the dielectric substrate 340.

Figure 5:
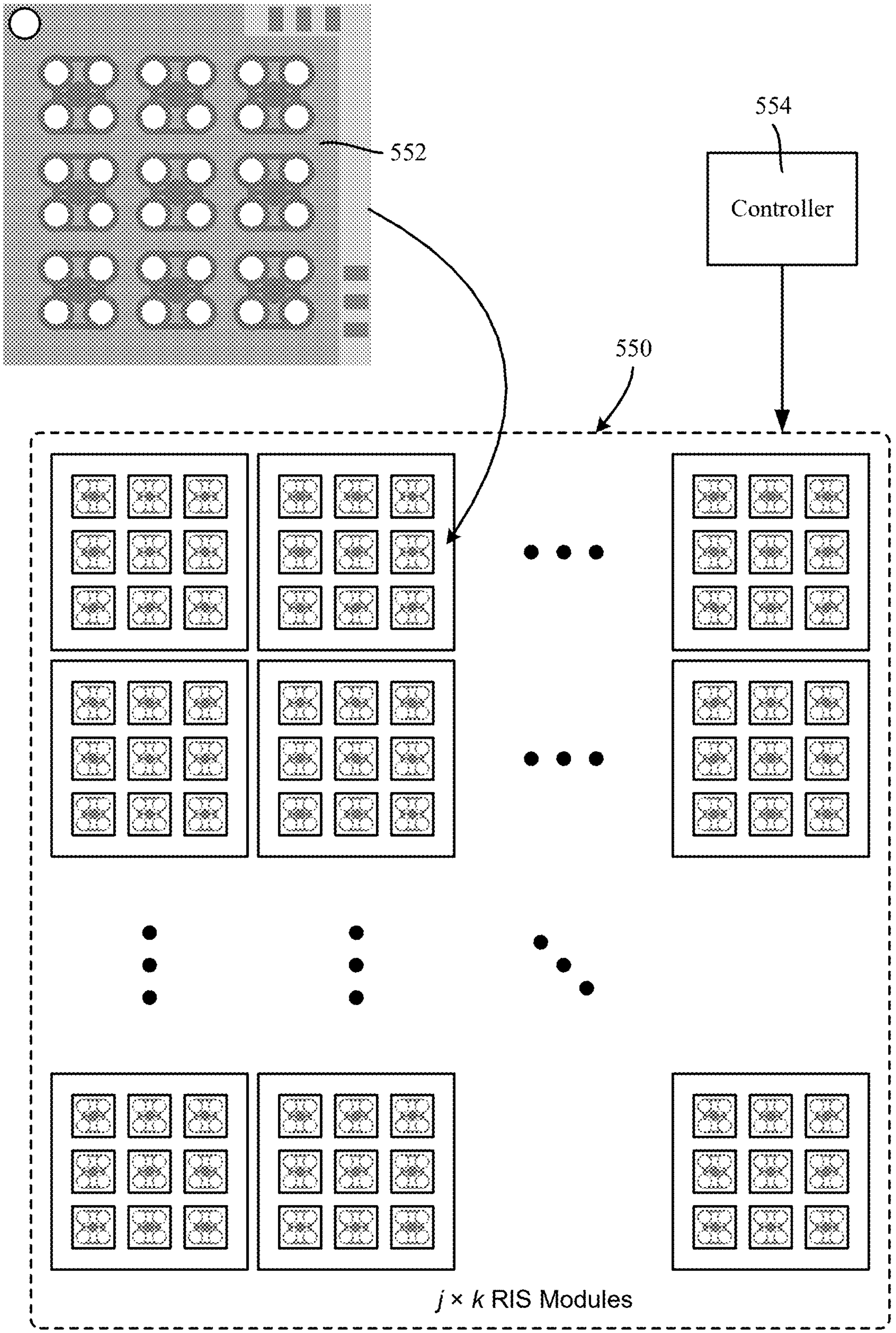
FIG. 5 is top view representation of the example design of a subarray along with a representation of combining subarrays into a larger reconfigurable intelligent surface, in accordance with various example embodiments and implementations of the subject disclosure.

In one implementation, terminals 447 are present at this lower level (insulated from the ground plane as represented in FIG. 5) for coupling DC voltage and switch control signaling to the powered circuitry (e.g., the switch 320, matching circuit 322 and amplifier 324). The terminals facilitate modular construction of subarrays, such that multiple subarray modules can be used to assemble a larger intelligent reconfigurable surface, as generally depicted in the j×k reconfigurable intelligent surface (RIS) 550 of FIG. 5 composed of multiple 3×3 subarrays of unit cells, e.g., each identical to or similar to the fabricated (top view) subarray 552, which shows a multi-layer design layout of an example implementation of a reconfigurable intelligent surface subarray.

A controller 554 coupled to or incorporated into the reconfigurable intelligent surface 552 can be employed to modify the reflected electromagnetic waves, as well as control the state of the switches with respect to selective amplification. As can be seen, the example design and implementation described herein advances reconfigurable intelligent surface technology through the integration of power amplifiers. However, given that power amplifiers can be significant power consumers, the inclusion of a switch per subarray balances between amplification needs and power efficiency, particularly in large-scale implementations. Further, because of the high costs and energy demands associated with equipping each reconfigurable intelligent surface element with its own power amplifier, described herein is integrating a single power amplifiers for every subarray of m×n elements. Proper impedance matching between the power amplifiers and the reconfigurable intelligent surface elements is maintained by using a matching circuit to minimize signal reflection. The shape and dimensions of the reconfigurable intelligent surface elements are selected such that they resonate at the desired wireless communication frequency, and the (e.g., hourglass-shaped) slots can achieve a broad bandwidth response in coupling RF energy from the incoming signal and transmitting the output signal.

The incorporation of switches provides refined control over the amplification process, selectively activated when needed, otherwise reflecting the signal as such in the desired direction. The use of selective amplification ensures efficient power usage and significantly boosts the reconfigurable intelligent surface's overall effectiveness. The reconfigurable intelligent surface 550 (e.g., via the controller 554 coupled thereto) can intelligently determine the need for signal enhancement or not based on varying network conditions, whereby the switch integration conserves energy at one time while enhancing the reconfigurable intelligent surface's adaptability and performance at another time. For example, an incoming signal that does not satisfy a threshold level (e.g., zero dBm) can be sensed by the reconfigurable intelligent surface's unit cells, and sent to and evaluated by the controller 554 to toggle the switch to turn on amplification, and vice-versa. This results in a versatile, energy-efficient, and effective solution for enhancing signal quality across wireless communication networks.

To summarize, in one example implementation, the reconfigurable intelligent surface structure described here is organized into several 3×3 subarrays, with each subarray containing one switch and one power amplifier. This configuration allows for expansion to larger reconfigurable intelligent surface sizes while efficiently managing the number of power amplifiers used. The design detailed in FIGS. 3 and 4 shows a layering and integration of components within the reconfigurable intelligent surface. The construction of the reconfigurable intelligent surface is divided into four main metal layers, namely the reflecting patterns layer, a slotted plane (or planes layer), the microstrip network layers and a ground plane. Between every two metal layers, there is an intervening layer of dielectric material.

The switch 320 and the power amplifier along with its peripheral circuit 323 can be surface mounted on the topmost layer, which includes the resonating elements that receive the incoming signal. There are two kinds of slots under each element, namely a receiving slot (e.g., first opening 410) and a transmitting slot (e.g., second opening 430). The (e.g., hourglass-shaped) slot openings are used to avoid any sharp discontinuities that limit the performance bandwidth. Energy from the incoming signal is gathered by the receiving slots and then channeled to the subarray's combining circuit (the first microstrip line 418), which is then selectively routed by the switch to the surface mounted power amplifier or to the subarray's dividing circuit (the second microstrip line 428), which distributes the non-amplified signal among the transmitting slots, whereby the signal is re-radiated from the top metallic elements. If amplification is selected, the dividing circuit (the second microstrip line 428) distributes the amplified signal among the transmitting slots, whereby the amplified signal is re-radiated from the top metallic elements.

Note that in one implementation, the design of the power dividing and combining circuit as described herein, along with the dielectric substrate, have been engineered to align with a characteristic impedance of 50 Ohms, targeting an operating frequency range centered at 28 GHz. In one example implementation, the thickness, dielectric constant, and other characteristics of the dielectric layers are chosen such that an impedance of 50 Ohms is maintained. Additionally, attention has been paid to the spacing between the microstrip lines of both the combining and dividing circuits, ensuring optimal separation to prevent any undesirable coupling between them.

Figure 6:
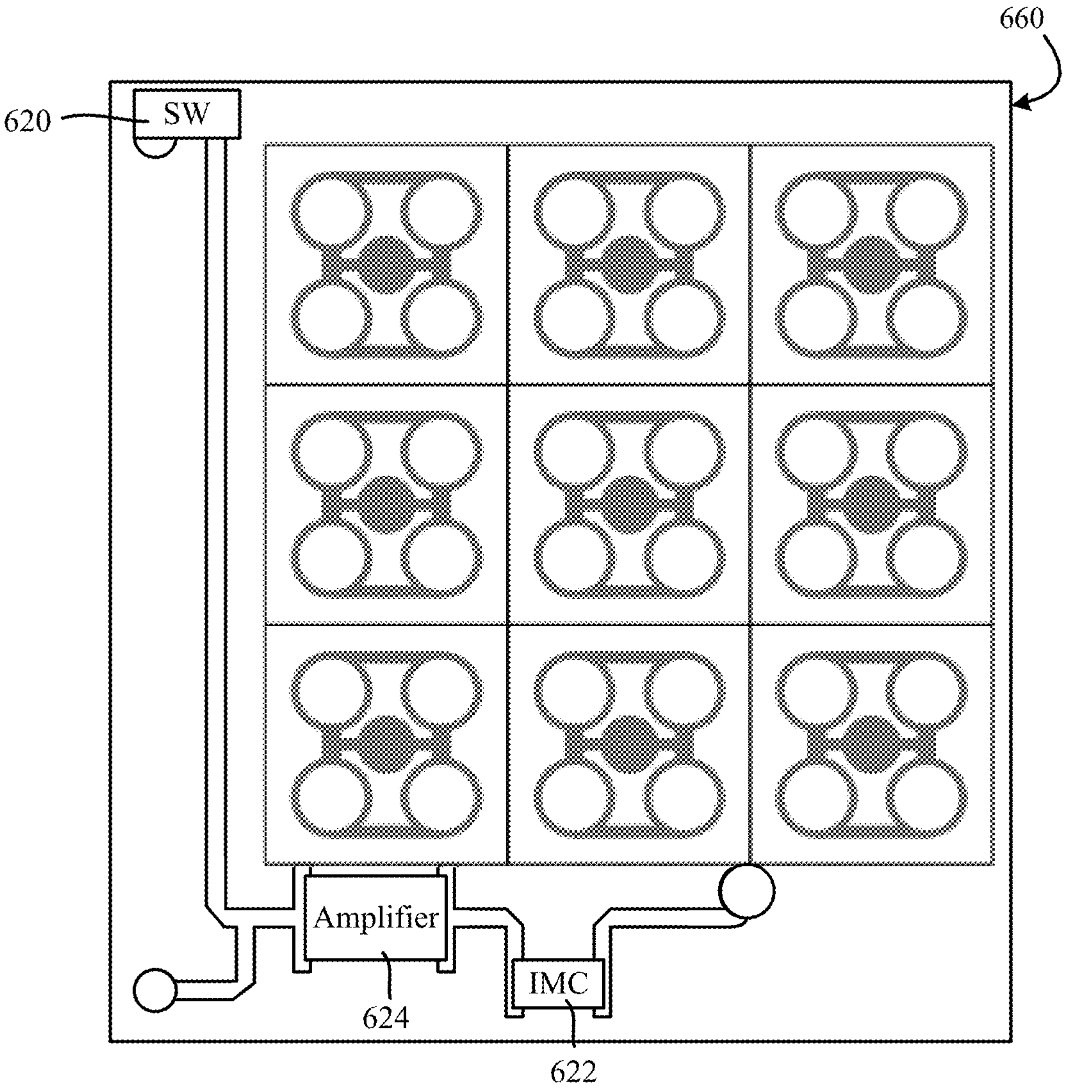
FIGS. 6-8 are top view representations showing various combinations of the layers of FIG. 4, in accordance with various example embodiments and implementations of the subject disclosure.
Figure 7:
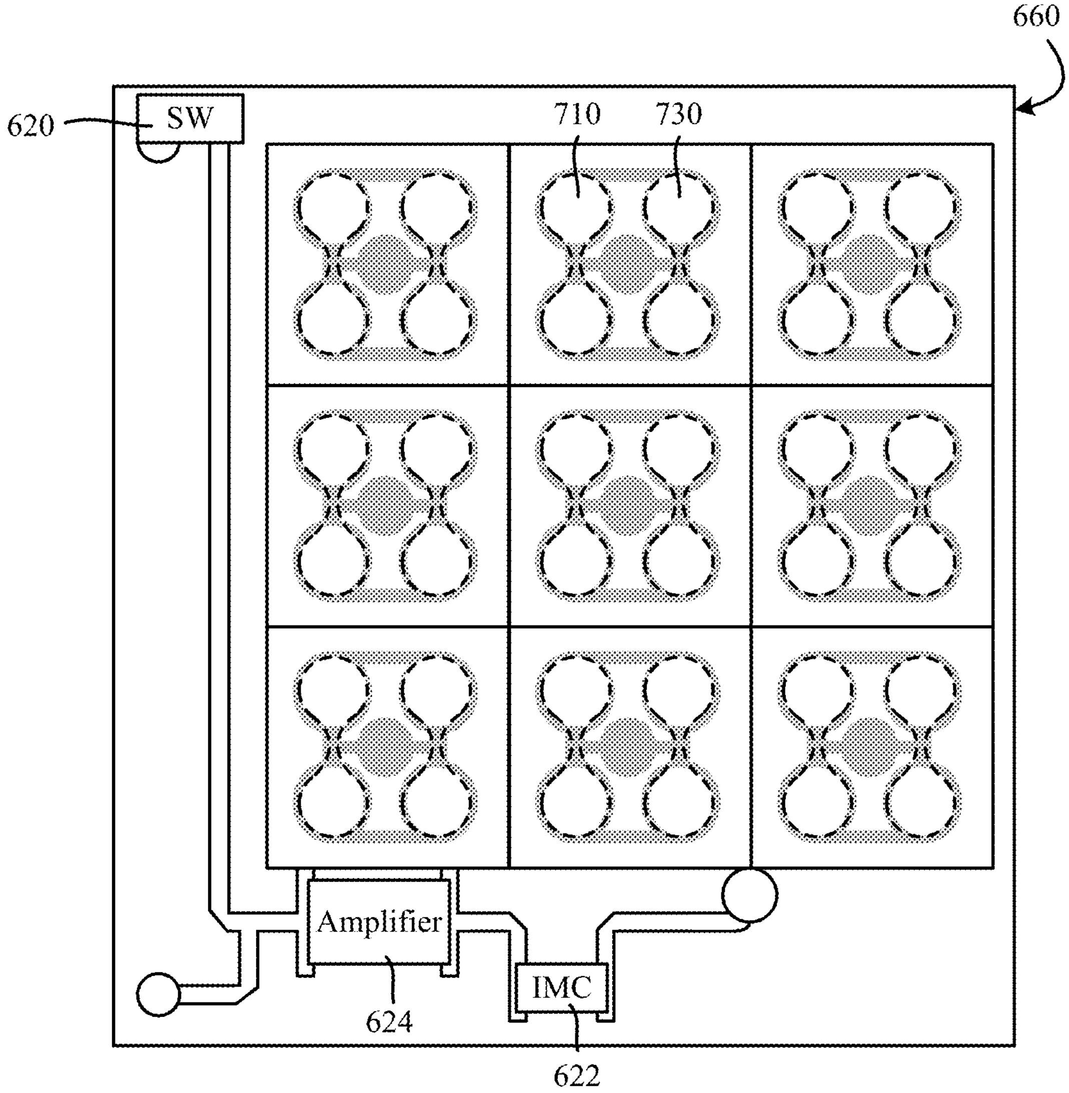
Figure 8:
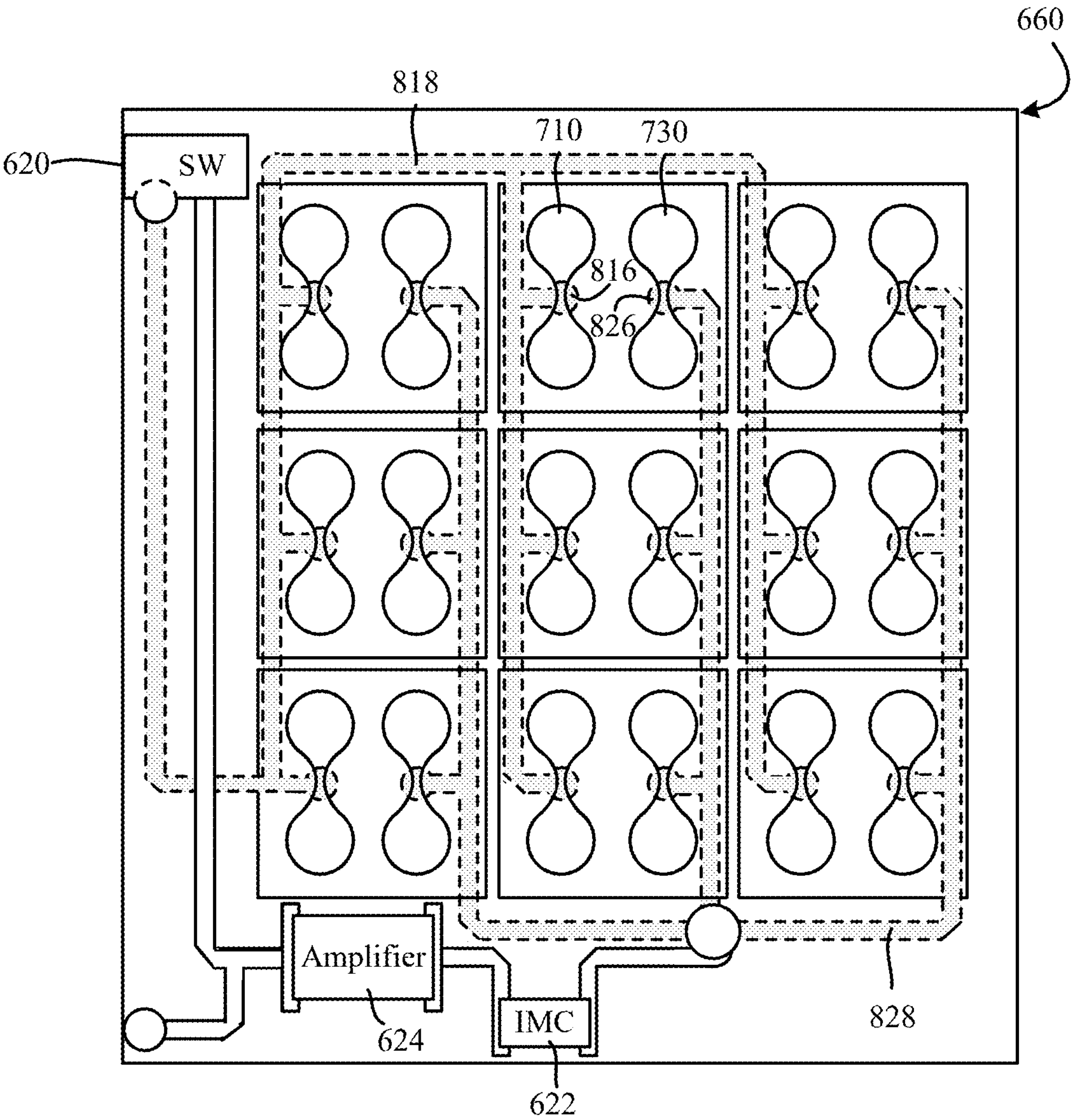

FIGS. 6-8 are top view representations of selected layers/levels of a 3×3 subarray 660 of nine unit cells generally corresponding to the example subarray 552 of FIG. 5. A switch (SW) 620, impedance matching circuit 622 and power amplifier 624 are shown as part of the subarray 660 in FIGS. 6-8; note that the positions of the impedance matching circuit 622 and power amplifier 624 relative to the switch 620 can be changed.

FIG. 7 is a top view corresponding to FIG. 6 that depicts the openings in the slotted plane layers beneath the top (resonating metallic pattern) layers and the upper dielectric layer. In this representation, the upper dielectric layer(s) are omitted to facilitate viewing of the slotted plane layers and their respective openings. One hourglass-shaped opening 710 for the incoming signal and one hourglass-shaped opening 730 for the outgoing (selectively amplified or non-amplified) signal are labeled in FIG. 7, although alternative shapes for the openings can be used.

FIG. 8 is a top view corresponding to FIGS. 6 and 7 that depicts the next layer beneath the slotted plane layers and the lower dielectric layer and above the substrate, that is, FIG. 8 shows the openings in the slotted plane layers above the level of the first and second microstrip lines 818 and 828, respectively. In this representation, the lower dielectric layer is omitted to facilitate viewing of the first and second microstrip lines.

As can be seen in FIG. 8, the first and second microstrip lines 818 and 828 (shaded and dashed when depicted below the top layer) are shared by each unit cell of the subarray. As also can be seen, the first microstrip line 818 has respective contacts/terminals that align with the respective centers of the respective first openings in the unit cells' respective slotted plane layers. Thus, for example, the contact labeled 816 (of the first microstrip line 818) aligns with the first opening 710, while the contact labeled 826 (of the second microstrip line 828) aligns with the second opening 730. In this way, the incoming signal is RF energy coupled to the switch 620 for selective amplifier input, while the outgoing (possibly amplified) signal at the contacts (including 826) is RF energy coupled through the aligned second openings (including 830).

It should be noted that the incoming signal and the redirected outgoing signal can be of the same polarization, because the length of the various conducting lines are sufficiently long to add delay to the redirected outgoing signal, without creating unwanted harmonics whether the signal is amplified or not. Notwithstanding, a delay line can be added, such as, for example, a line having some portion that meanders on the line from the first microstrip line 828 to the switch 620 to increase delay a desired, fixed amount; (a digital delay is also feasible).

The design and evaluation of both the unit cell and the reconfigurable intelligent surface panel have been performed through comprehensive full wave simulations using 3D electromagnetic (EM) simulation software (e.g., Ansys HFSS). The results are shown in the graphical representations of FIGS. 9 and 10.

Figure 9:
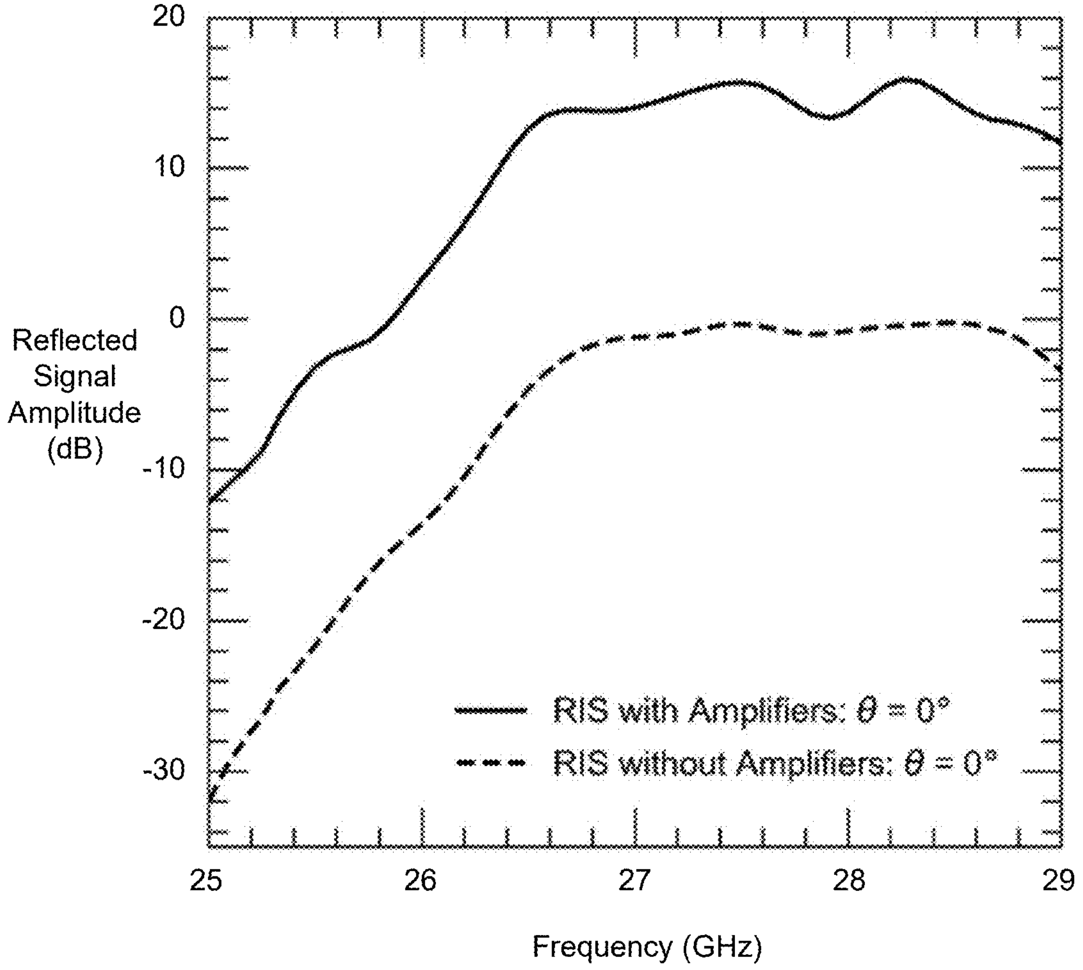
FIG. 9 is a graphical representation comparing an example reconfigurable intelligent surface with selective amplification (amplification or no amplification) as described herein when the incoming RF signal is normal to the reconfigurable intelligent surface, in accordance with various example embodiments and implementations of the subject disclosure.

When the incident signal is normal to the surface of the evaluated reconfigurable intelligent surface, which means that the angle of arrival (AoA), θ is 0°, FIG. 9 shows the significant difference in reflected signal amplitude for a reconfigurable intelligent surface with and without amplification. The passive gain of the evaluated reconfigurable intelligent surface lies between −2 dB and 0 dB from 26.5 GHz to 29 GHz, while the active gain is between 12 dB to 16 dB for the same frequency range.

Figure 10:
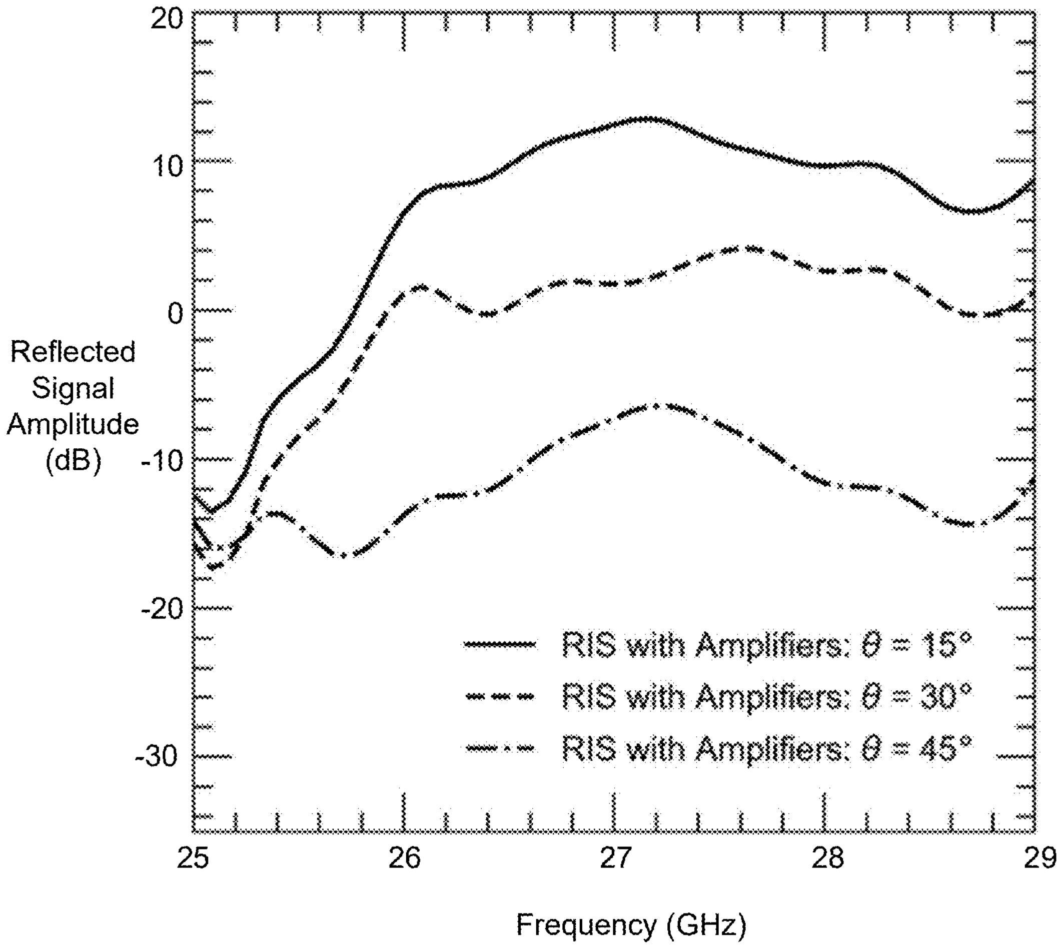
FIG. 10 is a graphical representation showing simulated reflected signal amplitudes for the incoming signal with angles of arrival of θ=15°, 30°, and 45°, in accordance with various example embodiments and implementations of the subject disclosure.

FIG. 10 shows the active gain from a reconfigurable intelligent surface for the incoming signal AoAs (θ) of 15°, 30°, and 45°. More specifically, for the incident angle of 15°, the reflected signal amplitude is 9.5±3 dB for the frequency band 26 GHz to 29 GHz. When the incoming signal hits the surface at 30°, the amplified reflected signal amplitude is 2±2.1 dB. For the incident angle of 45°, the reflected signal amplitude is 10±4 dB for the frequency range 26 GHz to 29 GHz.

One or more example embodiments can be embodied in a system, such as described and represented herein. The system can include a subgroup of unit cells of a reconfigurable intelligent surface, in which the subgroup of unit cells is electrically coupled to a switch shared by the subgroup. The subgroup is configured to receive an electromagnetic signal to obtain a received electromagnetic signal and couple the received electromagnetic signal to a first microstrip line. At a first time, the subgroup is configured to maintain the switch in a first selected state to electrically couple the first microstrip line to a power amplifier, to output an amplified electromagnetic signal to a second microstrip line electrically coupled to the power amplifier, wherein the amplified electromagnetic signal is coupled from the second microstrip line to respective resonating metallic portions of respective unit cells of the subgroup, to redirect the amplified electromagnetic signal from the subgroup as a redirected amplified electromagnetic signal. At a second time that is different from the first time, the subgroup is configured to maintain the switch in a second selected state that bypasses the power amplifier and electrically couples the first microstrip line to the second microstrip line, to couple the received electromagnetic signal to the second microstrip line, wherein the received electromagnetic signal from the second microstrip line is coupled to the respective resonating metallic portions of the respective unit cells of the subgroup, to redirect the received electromagnetic signal from the subgroup as a redirected instance of the received electromagnetic signal.

The respective unit cells of the subgroup can couple the received electromagnetic signal to the first microstrip line via first respective openings of a slotted plane layer, and the respective unit cells of the subgroup can couple the amplified and delayed electromagnetic signal to the respective resonating metallic portions via second respective openings of the slotted plane layer The first respective openings can be shaped as hourglass shapes, shaped as rectangular slots, shaped as circular coupled slots, or shaped as ring-shaped slots, or indeed, shaped with any arbitrary slot shape that can couple a maximum amount of signal to the microwave circuit/signal pickup terminals (of the microstrip lines) underneath.

The second respective openings can be shaped as hourglass shapes, shaped as rectangular slots, shaped as circular coupled slots, or shaped as ring-shaped slots, or indeed, shaped with any arbitrary slot shape that can couple a maximum amount of signal from the microwave circuit/signal pickup terminals (of the microstrip lines) underneath.

The first respective openings and second respective openings can be sized to correspond to a resonating frequency of the respective resonating metallic portions.

The redirected amplified electromagnetic signal can have a same polarization as the received electromagnetic signal.

The redirected instance of the received electromagnetic signal can have a same polarization as the received electromagnetic signal.

Further embodiments can include an impedance matching circuit coupled to the power amplifier.

The subgroup can include a two-dimensional array of the respective unit cells. The two-dimensional array can include a first number of unit cells in a first dimension that equals a second number of unit cells in a second dimension. The two-dimensional array can include four unit cells arranged as two unit cells by two unit cells, nine unit cells arranged as three unit cells by three unit cells, sixteen unit cells arranged as four unit cells by four unit cells, or twenty-five unit cells arranged as five unit cells by five unit cells. The two-dimensional array can include a first number of unit cells in a first dimension that does not equal a second number of unit cells in a second dimension.

The subgroup can include a first modular array of the respective unit cells that is configured to couple to a second modular array of the reconfigurable intelligent surface.

One or more example embodiments can be embodied in a unit cell, such as described and represented herein. The unit cell includes a resonating metallic portion, and a slotted plane that includes a first opening configured to pass an impinging electromagnetic wave as a passed electromagnetic wave to a first microstrip line coupled to the unit cell, in which the unit cell is configured to redirect the impinging electromagnetic wave, and is coupled to a switch. The switch can be in a first switch state that electrically couples the first microstrip line to a power amplifier that amplifies the passed electromagnetic wave into an amplified electromagnetic wave obtained by a second microstrip line coupled to the unit cell; the slotted plane includes a second opening configured to pass the amplified electromagnetic wave from the second microstrip line to the resonating metallic portion, to redirect the amplified electromagnetic wave as a reflected amplified electromagnetic wave. The switch can be in a second switch state that bypasses the power amplifier and electrically couples the first microstrip line to the second microstrip line coupled to the unit cell, and the slotted plane that includes the second opening configured to pass the passed electromagnetic wave from the second microstrip line to the resonating metallic portion, to redirect the impinging electromagnetic wave as a reflected electromagnetic wave.

Further embodiments can include a first dielectric layer between the resonating metallic portion and the slotted plane, a second dielectric layer between the slotted plane and the first microstrip line, and a dielectric substrate between the second microstrip line and a ground plane of the unit cell.

The unit cell can be a first unit cell, the reflected amplified electromagnetic wave can include a first instance of the reflected amplified electromagnetic wave from the first unit cell, the first unit cell can be electrically coupled to a second unit cell by the first microstrip line to share the power amplifier, the first unit cell and the second unit cell can be electrically coupled to the second microstrip line, and the reflected amplified electromagnetic wave can include a second instance of the reflected amplified electromagnetic wave from the second unit cell that combines with the first instance of the reflected amplified electromagnetic wave from the first unit cell.

One or more example embodiments can be embodied in a device, such as described and represented herein. The device can include a subgroup of unit cells of a reconfigurable intelligent surface, and a switch shared by the subgroup. Each unit cell can include a resonating metallic pattern corresponding to a resonating frequency, a slotted plane that can include a first opening that passes impinging electromagnetic signals to a first contact of a first microstrip line, in which the first microstrip line is shared by the subgroup and is electrically coupled to an input of the switch. The slotted plane can include a second opening that passes electromagnetic signals from a second contact of a second microstrip line to the resonating metallic pattern, in which the second microstrip line is shared by the subgroup. The switch can be operational in a first switch state to electrically couple a first output of the switch to a power amplifier shared by the subgroup, and the power amplifier can be coupled to the second microstrip line to pass the electromagnetic signals as amplified electromagnetic signals to resonating metallic patterns of the unit cells, to redirect the impinging electromagnetic signals as amplified electromagnetic signals. The switch can be operational in a second state to electrically couple a second output of the switch to the second microstrip line, while bypassing the power amplifier, to pass non-amplified electromagnetic signals to the resonating metallic patterns of the unit cells, to redirect the impinging electromagnetic signals as the non-amplified electromagnetic signals.

The first opening and the second opening of each unit cell can be shaped and/or sized to correspond to the resonating frequency. The subgroup can include a first subgroup arranged as a first modular array of the respective unit cells that can be configured to couple to a second subgroup arranged as a second modular array of the reconfigurable intelligent surface. The subgroup can include an impedance matching circuit coupled to the power amplifier.

As can be seen, the technology described herein is directed to an intelligent reconfigurable service based on modular devices for receiving and reflecting an electromagnetic signal, in which the reflected electromagnetic signal can be selectively amplified or not amplified. The design results in a versatile and power-smart implementation for improving signal quality in wireless communication networks, balancing between lowering costs, enhancing functionality, and managing system intricacy. The switch allows for dynamic signal amplification, providing an efficient and adaptable solution in varying signal conditions. The technology described herein overcomes the previous challenges of signal power loss and double fading, through a compact, monolithic structure that seamlessly integrates switches and power amplifiers, along with their matching networks in an intelligent reconfigurable service module.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As used in this application, the terms "component," "system," "platform," "layer," "selector," "interface," and the like are intended to refer to a computer-related resource or an entity related to an operational apparatus with one or more specific functionalities, wherein the entity can be either hardware, a combination of hardware and software, software, or software in execution. As an example, a component can be an apparatus with specific functionality provided by mechanical parts operated by electric or electronic circuitry. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather are to be construed in breadth, spirit and scope in accordance with the appended claims.

What is claimed is:

1. A system, comprising:

a subgroup of unit cells of a reconfigurable intelligent surface, the subgroup of unit cells electrically coupled to a switch shared by the subgroup, the subgroup configured to:

receive an electromagnetic signal to obtain a received electromagnetic signal;

couple the received electromagnetic signal to a first microstrip line;

at a first time, maintain the switch in a first selected state to electrically couple the first microstrip line to a power amplifier, to output an amplified electromagnetic signal to a second microstrip line electrically coupled to the power amplifier, wherein the amplified electromagnetic signal is coupled from the second microstrip line to respective resonating metallic portions of respective unit cells of the subgroup, to redirect the amplified electromagnetic signal from the subgroup as a redirected amplified electromagnetic signal; and at a second time that is different from the first time, maintain the switch in a second selected state that bypasses the power amplifier and electrically couples the first microstrip line to the second microstrip line, to couple the received electromagnetic signal to the second microstrip line, wherein the received electromagnetic signal from the second microstrip line is coupled to the respective resonating metallic portions of the respective unit cells of the subgroup, to redirect the received electromagnetic signal from the subgroup as a redirected instance of the received electromagnetic signal.

2. The system of claim 1, wherein the respective unit cells of the subgroup couple the received electromagnetic signal to the first microstrip line via first respective openings of a slotted plane layer, and wherein the respective unit cells of the subgroup couple the amplified and delayed electromagnetic signal to the respective resonating metallic portions via second respective openings of the slotted plane layer.

3. The system of claim 2, wherein the first respective openings are shaped as hourglass shapes, shaped as rectangular slots, shaped as circular coupled slots, or shaped as ring-shaped slots.

4. The system of claim 2, wherein the second respective openings are shaped as hourglass shapes, shaped as rectangular slots, shaped as circular coupled slots, or shaped as ring-shaped slots.

5. The system of claim 2, wherein the first respective openings and second respective openings are sized to correspond to a resonating frequency of the respective resonating metallic portions.

6. The system of claim 1, wherein the redirected amplified electromagnetic signal has a same polarization as the received electromagnetic signal.

7. The system of claim 1, wherein the redirected instance of the received electromagnetic signal has a same polarization as the received electromagnetic signal.

8. The system of claim 1, further comprising an impedance matching circuit coupled to the power amplifier.

9. The system of claim 1, wherein the subgroup comprises a two-dimensional array of the respective unit cells.

10. The system of claim 9, wherein the two-dimensional array comprises a first number of unit cells in a first dimension that equals a second number of unit cells in a second dimension.

11. The system of claim 9, wherein the two-dimensional array comprises: four unit cells arranged as two unit cells by two unit cells, nine unit cells arranged as three unit cells by three unit cells, sixteen unit cells arranged as four unit cells by four unit cells, or twenty-five unit cells arranged as five unit cells by five unit cells.

12. The system of claim 9, wherein the two-dimensional array comprises a first number of unit cells in a first dimension that does not equal a second number of unit cells in a second dimension.

13. The system of claim 1, wherein the subgroup comprises a first modular array of the respective unit cells that is configured to couple to a second modular array of the reconfigurable intelligent surface.

14. A unit cell, comprising:

a resonating metallic portion; and a slotted plane comprising a first opening configured to pass an impinging electromagnetic wave as a passed electromagnetic wave to a first microstrip line coupled to the unit cell, the unit cell being configured to redirect the impinging electromagnetic wave, and being coupled to a switch that, in a first switch state, electrically couples the first microstrip line to a power amplifier that amplifies the passed electromagnetic wave into an amplified electromagnetic wave obtained by a second microstrip line coupled to the unit cell, and the slotted plane comprising a second opening configured to pass the amplified electromagnetic wave from the second microstrip line to the resonating metallic portion, to redirect the amplified electromagnetic wave as a reflected amplified electromagnetic wave; and in a second switch state, bypasses the power amplifier and electrically couples the first microstrip line to the second microstrip line coupled to the unit cell, and the slotted plane comprising the second opening configured to pass the passed electromagnetic wave from the second microstrip line to the resonating metallic portion, to redirect the impinging electromagnetic wave as a reflected electromagnetic wave.

15. The unit cell of claim 14, further comprising a first dielectric layer between the resonating metallic portion and the slotted plane, a second dielectric layer between the slotted plane and the first microstrip line, and a dielectric substrate between the second microstrip line and a ground plane of the unit cell.

16. The unit cell of claim 14, wherein the unit cell is a first unit cell, wherein the reflected amplified electromagnetic wave comprises a first instance of the reflected amplified electromagnetic wave from the first unit cell, wherein the first unit cell is electrically coupled to a second unit cell by the first microstrip line to share the power amplifier, wherein the first unit cell and the second unit cell are electrically coupled to the second microstrip line, and wherein the reflected amplified electromagnetic wave comprises a second instance of the reflected amplified electromagnetic wave from the second unit cell that combines with the first instance of the reflected amplified electromagnetic wave from the first unit cell.

17. A device, comprising:

a subgroup of unit cells of a reconfigurable intelligent surface;

a switch shared by the subgroup;

each unit cell comprising:

a resonating metallic pattern corresponding to a resonating frequency, a slotted plane comprising a first opening that passes impinging electromagnetic signals to a first contact of a first microstrip line, wherein the first microstrip line is shared by the subgroup and is electrically coupled to an input of the switch, and the slotted plane comprising a second opening that passes electromagnetic signals from a second contact of a second microstrip line to the resonating metallic pattern, wherein the second microstrip line is shared by the subgroup;

wherein the switch is operational in a first switch state to electrically couple a first output of the switch to a power amplifier shared by the subgroup, the power amplifier coupled to the second microstrip line to pass the electromagnetic signals as amplified electromagnetic signals to resonating metallic patterns of the unit cells, to redirect the impinging electromagnetic signals as amplified electromagnetic signals, and wherein the switch is operational in a second state to electrically couple a second output of the switch to the second microstrip line, while bypassing the power amplifier, to pass non-amplified electromagnetic signals to the resonating metallic patterns of the unit cells, to redirect the impinging electromagnetic signals as the non-amplified electromagnetic signals.

18. The device of claim 17, wherein the first opening and the second opening of each unit cell are shaped and sized to correspond to the resonating frequency.

19. The device of claim 17, wherein the subgroup comprises a first subgroup arranged as a first modular array of the respective unit cells that is configured to couple to a second subgroup arranged as a second modular array of the reconfigurable intelligent surface.

20. The device of claim 17, wherein the subgroup comprises an impedance matching circuit coupled to the power amplifier.

* * * * *